United States Patent [19]

Gleskova et al.

[11] Patent Number: 6,080,606
[45] Date of Patent: *Jun. 27, 2000

[54] ELECTROPHOTOGRAPHIC PATTERNING OF THIN FILM CIRCUITS

[75] Inventors: Helena Gleskova, Princeton, N.J.; Dashen Shen, Madison, Ala.; Sigurd Richard Wagner, Princeton, N.J.

[73] Assignee: The Trustees of Princeton University, Princeton, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/621,582

[22] Filed: Mar. 26, 1996

[51] Int. Cl.$^7$ .............................. H01L 21/00; H01L 21/20
[52] U.S. Cl. .................. 438/151; 438/152; 438/160; 438/586; 430/126
[58] Field of Search ........................ 257/67, 72; 438/151, 438/152, 160, 586; 430/126

[56] References Cited

U.S. PATENT DOCUMENTS

| | | | |
|---|---|---|---|
| 4,002,945 | 1/1977 | Van Houten et al. | 315/58 |
| 4,332,075 | 6/1982 | Ota et al. | 257/72 |
| 4,500,617 | 2/1985 | Nakayama | 430/54 |
| 4,661,431 | 4/1987 | Bujese | 430/126 |
| 4,879,184 | 11/1989 | Bujese et al. | 430/126 |
| 4,884,079 | 11/1989 | Inoue et al. | 346/1.1 |
| 4,897,329 | 1/1990 | Nakayama | 430/156 |

(List continued on next page.)

OTHER PUBLICATIONS

H. Gleskova, S. Wagner, and D.S. Shen; "Electrophotographic Patterning of Thin–Film Silicon on Glass Foil"; *IEEE Electron Device Letters*, vol. 16, No. 10; pp. 418–420, Oct., 1995.

H. Gleskova, S. Wagner, and D.S. Shen; "Electrophotographic Patterning of a–Si:H"; *AMLCDs '95 Workshop Proceedings —Second International Workshop on Active Matrix Liquid Crystal Displays*,pp. 16–19, Sep. 25–26, 1995.

D.S. Shen, H. Gleskova, and S. Wagner; "Patterning of a–Si:H by Laser Printing"; *SID 95 Digest*, First Edition, May, 1995, pp. 587–590.

D.S. Shen and H. Ogura; "Integrated Amorphous Silicon Photoconductive Type Image Sensor"; *IEEE 1992*, pp. 358–362.

J. Macneil, A.E. Delahoy, F. Kampas, E. Eser, A. Varvar, and F. Ellis, Jr., "A 10 MWp a–Si:H Module Processing Line", in *Conf. Rec. 21st IEEE Photovoltaic Specialists Conf.*, IEEE, New York 1990, pp. 1501–1505.

M. Hijikigawa and H. Take, "Future Prospects of Large–Area Direct–View LCDs", *1995 SID Internat. Symp.*, Digest of Technical Papers, SID, Santa Ana, California, 1995, pp. 147–149.

S. Morozumi, "Issues in Manufacturing Active–Matrix LCDs", in *Seminar Lecture Notes*, vol. U, SID Symposium, Boston, Massachusetts, May 18–22, 1992, pp. F–3/1–50; SID, Play del Rey, California, 1992.

(List continued on next page.)

*Primary Examiner*—Richard Elms
*Assistant Examiner*—Michael S. Lebentritt
*Attorney, Agent, or Firm*—Kenneth Watov; Watov & Kipnes, P.C.

[57] ABSTRACT

Amorphous silicon thin-film transistors on glass foil are made using exclusively electrophotographic printing for pattern formation, contact hole opening, and device isolation. Toner etch masks are applied by feeding the glass substrate through a laser printer or photocopier, or from laser-printed patterns on transfer paper. This all-printed patterning is a low-cost, large-area circuit processing technology, suitable for producing backplanes for active matrix liquid crystal displays.

34 Claims, 4 Drawing Sheets

U.S. PATENT DOCUMENTS

| | | | |
|---|---|---|---|
| 4,918,504 | 4/1990 | Kato et al. | 257/72 |
| 5,011,758 | 4/1991 | Detig et al. | 430/100 |
| 5,470,644 | 11/1995 | Durant | 428/209 |
| 5,576,135 | 11/1996 | Nishikawa | 430/126 |
| 5,640,189 | 6/1997 | Ohno et al. | 347/141 |

OTHER PUBLICATIONS

W. O'Mara, "AMLCD Manufacturing" in *Seminar Lecture Notes*, vol. I, SID Symposium, San Jose, California, Jun. 13–17, 1994, pp. M–3/1–40; SID, Santa Ana, California, 1994.

H. Mirimoto and M. Izu, "Mass Production Technology in a Roll–To–Roll Process", in *JARECT*, vol. 16, Amorphous Semiconductor Technologies and Devices, Y. Hamakawa, ed., Ohmsha, Tokyo 1984, pp. 212–221.

K. Nakatani, M. Yano, K. Suzuki, and H. Okaniwa, "Properties of Microcrystalline P–Doped Si:H Films", *J. Non–Cryst. Solids*, vol. 59/60, pp. 827–830, 1983.

H. Curtins, N. Wyrsch and A.V. Shah, "High–Rate Deposition of Amorphous Hydrogenated Silicon: Effect of Plasma Excitation Frequency", *Electronics Letters*, vol. 23, pp. 228–230, 1987.

ELECTROPHOTOGRAPHIC PATTERNING OF THIN FILM CIRCUITS

GOVERNMENT LICENSE RIGHTS

This invention was made with Government support under Contract No. F33615-94-1-4448, awarded by ARPA through WPAFB. The government has certain rights in this invention.

FIELD OF THE INVENTION

The field of this invention relates generally to the production of thin film transistors (TFTs), and more particularly, to the production of large area circuits and arrays of TFTs.

BACKGROUND OF THE INVENTION

Large-area electronics, based mostly on thin-film amorphous silicon, is under rapid development. 40×120 cm$^2$ solar panels [J. Macneil, A. E. Delahoy, F. Kampas, E. Eser, A. Varvar, and F. Ellis, Jr., "A 10 MWp a-Si:H module processing line", in Conf. Rec. 21st IEEE Photovoltaic Specialists Conf., IEEE, New York 1990, pp. 1501-1505] and 21-inch-diagonal active-matrix liquid-crystal displays (AMLCDs) [M. Hijikigawa and H. Take, "Future prospects of large-area direct-view LCDs", 1995 SID Internat. Symp., Digest of Technical Papers, SID, Santa Ana, Calif., 1995, pp. 147-149] illustrate this new era of semiconductor technology. Much of the present-day manufacture of thin-film electronics is derived from integrated circuit fabrication. A principal factor in the widespread use of integrated circuits has been their low cost, which is a consequence of their high functional density achieved by miniaturization. Unfortunately, the path of miniaturization by definition cannot be taken to reduce the cost-per-function of large-area electronics [S. Morozumi, "Issues in Manufacturing Active-Matrix LCDS", in Seminar Lecture Notes, Vol. II, SID Symposium, Boston, Mass., May 18–22, 1992, pp. F-3/1-50; SID, Playa del Rey, Calif., 1992] and [W. O' Mara, "AMLCD manufacturing" in Seminar Lecture Notes, Vol. I, SID Symposium, San Jose, Calif., Jun. 13–17, 1994, pp. M-3/1-40; SID, Santa Ana, Calif., 1994]. Instead, new materials and processing techniques are needed, such as metal foil [H. Morimoto and M. Izu, "Mass production technology in a roll-to-roll process", in JARECT, Vol. 16, Amorphous Semiconductor Technologies and Devices, Y. Hamakawa, ed., Ohmsha, Tokyo 1984, pp. 212–221.] and plastic substrates [K. Nakatani, M. Yano, K. Suzuki, and H. Okaniwa, "Properties of microcrystalline p-doped Si:H films", J. Non-Cryst. Solids, Vol. 59/60, pp. 827–830, 1983.], as well as high deposition rates [H. Curtins, N. Wyrsch and A. V. Shah, "High-rate deposition of amorphous hydrogenated silicon: effect of plasma excitation frequency", Electronics Letters, Vol. 23, pp. 228–230, 1987.].

The photolithographic patterning techniques used in current AMLCD manufacturing were developed for the manufacturing of integrated circuits on silicon wafers, and are correspondingly expensive. Typically, six to nine thin film layers are used in the manufacturing of the backplane circuit, with photolithography required at each step [W. O' Mara, Ibid]. Exposure by stepper requires stitching [S. Morozumi, Ibid], which is slow.

In order to decrease the price of AMCLDS, new alternative and cheaper methods of manufacturing are required.

SUMMARY OF THE INVENTION

With the problems of the prior art in mind, an object of the invention is to provide a new process for making thin film transistors.

Another object of the invention is to provide a new process for making large arrays of thin film transistors.

Another object of the invention is to provide a new process for very low cost production of TFTs and arrays.

Another object of the invention is to provide for a drastic reduction of process steps by allowing the use of high-throughput, roll-to-roll or sheet-fed type printing techniques to produce TFT arrays.

Another object of the invention is to provide a new non-photolithographic patterning technology for AMLCD manufacturing.

These and other objects of the invention are provided by an improved process which consists of using laser-printed (or photocopied) toner as the etch mask and requires the following steps: (1) pattern generation; (2) printing of the pattern on a film/substrate combination compatible with laser printing; and (3) selective etching or lift-off. The invention provides for rapid and continuous processing for providing light-weight, large-area circuits, made with the novel combination of foil glass and the low thermal budgets associated with hydrogenated amorphous silicon (a-Si:H) with a processing technique, electrophotographic printing. Note that use of a laser printer is preferred.

The invention also provides for amorphous silicon thin-film transistors, diodes, and other semiconductor devices, to be fabricated on glass foil or other suitable base material, using exclusively electrophotographic printing for mask pattern formation, contact hole opening, and device isolation.

BRIEF DESCRIPTION OF THE DRAWINGS

Various embodiments of the invention are illustrated and described below with reference to the accompanying drawings, in which like items are identified by the same reference designation, wherein.

DETAILED DESCRIPTION OF THE INVENTION

The widespread introduction of large-area electronics, such as flat-panel displays, is contingent on a revolution of the manufacturing technology of integrated circuits. The cost of making a DRAM typically is $3/cm$^2$ to $5/cm$^2$. A one-square meter wall display should cost less than 10¢/cm$^2$. Possible sources of cost reduction are: (1) Relaxed design rules—in a square-meter size display one subpixel will measure hundreds of $\mu$m on a side; (2) Low temperature processing technology to enable the use of a wide range of inexpensive materials; (3) Film application and patterning techniques derived from printing.

In one embodiment of the invention for processing a single layer of a selected material for etching, glass foil for example, a mask pattern is first generated. The next step is to pass the glass foil through the electrophotographic printing apparatus for printing the toner onto the glass foil in the form of the mask pattern. Etchant is then applied in a conventional manner. After etching, the toner is typically stripped off of the glass foil or other sheet material being processed.

In another embodiment of the invention simple amorphous silicon transistors are fabricated by using exclusively electrophotographic printing for pattern formation, contact hole opening, and device isolation. The performance of the transistors made by this technique demonstrates that the all printed patterning is a practical large-area technology, as described in detail below for the present invention.

Figure 1A:
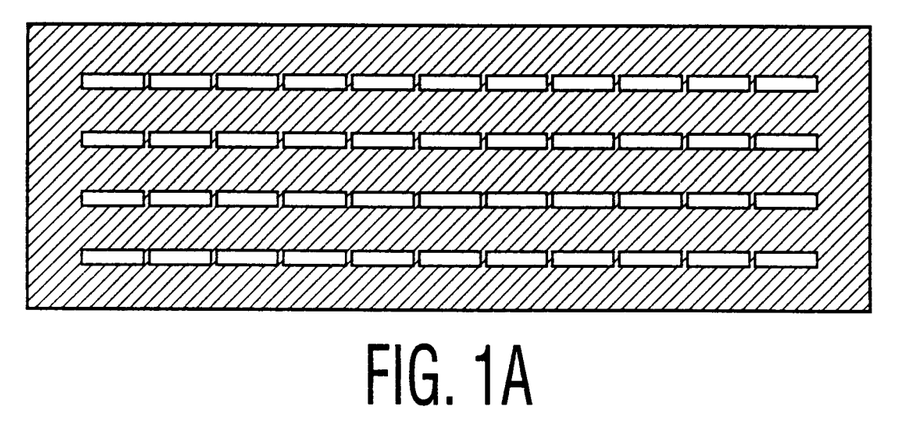
FIG. 1A shows the toner mask used for a negative source-drain pattern for one embodiment of this invention.
Figure 1B:
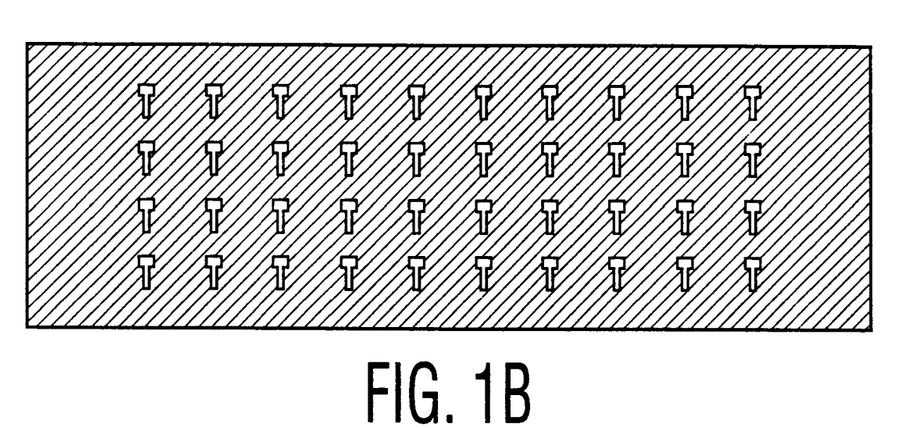
FIG. 1B shows the toner mask used for a negative gate pattern, in this example.
Figure 1C:
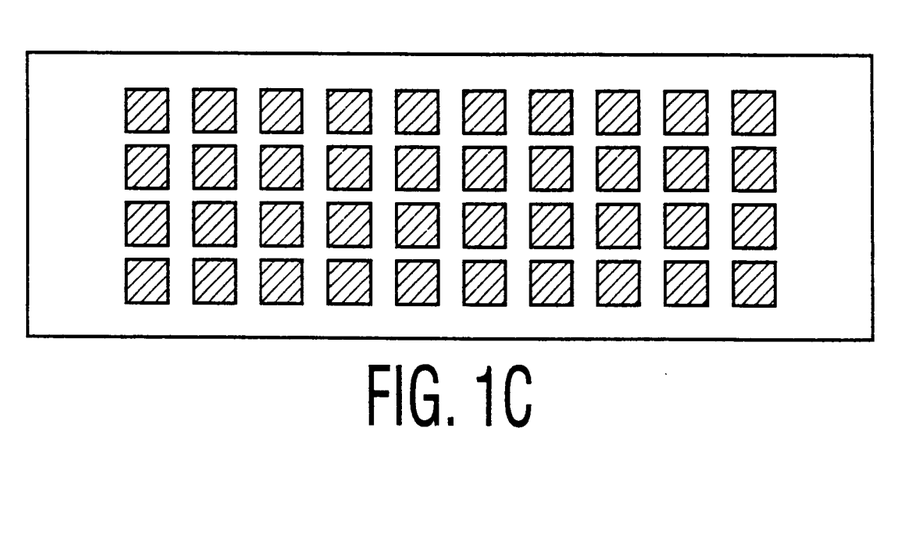
FIG. 1C shows the toner mask used for a positive pattern for contact hole opening and transistor separation, in this example.

A process for another embodiment of the invention will now be described. A laser printed or photocopied toner is used as an etch mask in this example. Such an etch mask requires the following steps: (1) pattern generation; (2) printing of the pattern on a film/substrate combination compatible with laser printing; and (3) selective etching. The toner also can substitute for photoresist in the lift-off technique. First, a process for one embodiment of this invention, in this case for making TFT's will be generally discussed, then this will be followed by a detailed discussion of the materials used and certain process details. Lastly, in an "Example" section, a specific embodiment of the invention will be described that includes use of a transfer paper technique. A process for an embodiment of the invention for making a TFT is as follows:

1) Generate the mask for producing the desired patterns using a computer with known programs for this purpose, in a preferred embodiment of the invention. Transferring the digitized mask data from the computer directly to a laser printer. Other known techniques can be used for generating the mask, which may require the use of a photocopier or laser printer in a more conventional manner, where a printed copy of the pattern generated is scanned by the printer. The masks generated are shown in FIGS. 1A–1C. Note that the cross-hatched portions of each mask are opaque, and other portions transparent.

2) Using a photocopier or a laser printer (not shown) to electrophotographically print the pattern in FIG. 1A on a clean substrate 2 (see FIG. 2A), in the form of toner 4. Post-bake the toner 4.

3) Deposit a conductor 6 on the above. A portion of the conductor 6 is deposited on the toner pattern 4 (see FIG. 2B) while another portion of conductor 8 is deposited directly to the substrate 2. Note that conductors 6 and 8 form a continuous layer, as shown in this example in FIG. 2B.

4) Dissolve the toner 4 with a solvent. The conductor 6 that had been sitting on the toner 4 will float away ("lift-off"), leaving behind, and still attached, the conductor 8 previously deposited on the substrate 2 (see FIG. 2C). As shown a two-layer stack has been produced at this stage with the conductor 8 being on the top of substrate 2.

5) Reclean, if necessary.

Figures 2A, 2B:
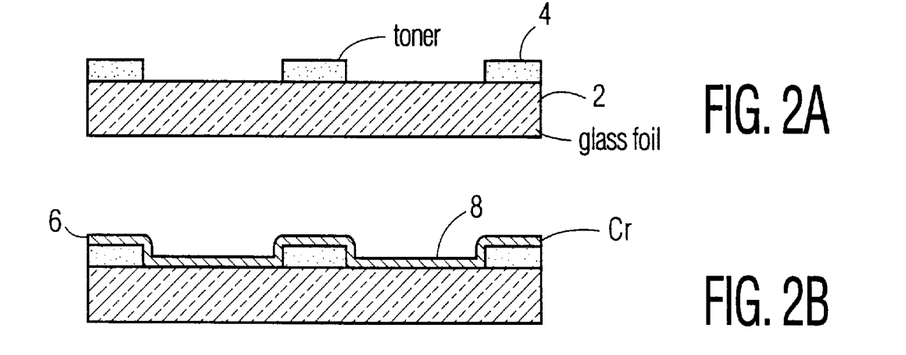
FIGS. 2A through 2L show each process step for one example of producing a TFT for one embodiment of the invention.
Figure 2C:
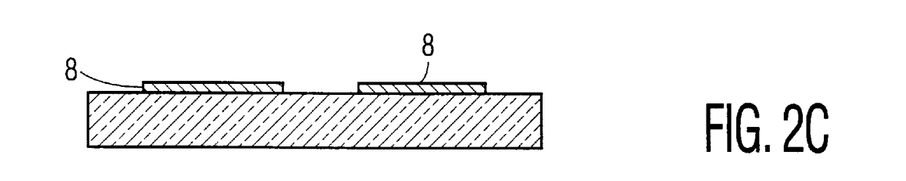
Figure 2D:
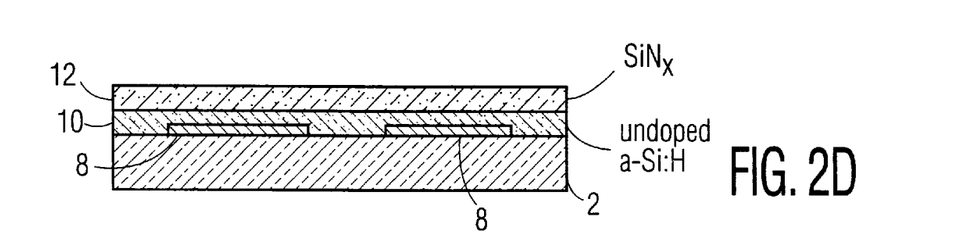

6) Deposit undoped amorphous silicon 10 on top of the stack (see FIG. 2D).

7) Deposit gate insulator 12 on the top of the stack (see FIG. 2D).

8) Deposit passivation (not shown) on the bottom of the substrate 2, in at least equal thickness to that on the top of the stack to prevent later backside etching. Note: if practical, steps 7 and 8 may be done simultaneously.

Figure 2E:
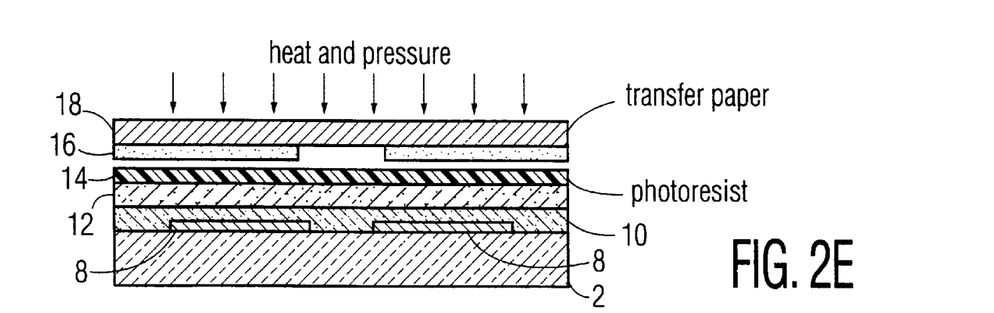

9) Deposit photoresist 14 on top of the stack (see FIG. 2E).

10) Print or place toner pattern 16 (see FIG. 1B) on the top of the stack. If the quantity of substrates being made is relatively small, then the toner pattern 16 is printed on transfer paper 18 which is then applied to the stack, optically aligned, and the toner transferred by applying heat and pressure (see FIG. 2E). The paper is then removed, leaving the toner on the stack (see FIG. 2F). If the quantity being made is large, then the toner 16 is more economically applied by installing a special alignment fixture in the photocopier or laser printer, akin to those found in four-color presses and color copiers, in order to achieve registration (see FIG. 2F). Note that when the toner 16 is applied by direct printing, it is post-baked. It is also post baked before etching, if required when printing with transfer paper 18.

Figure 2F:
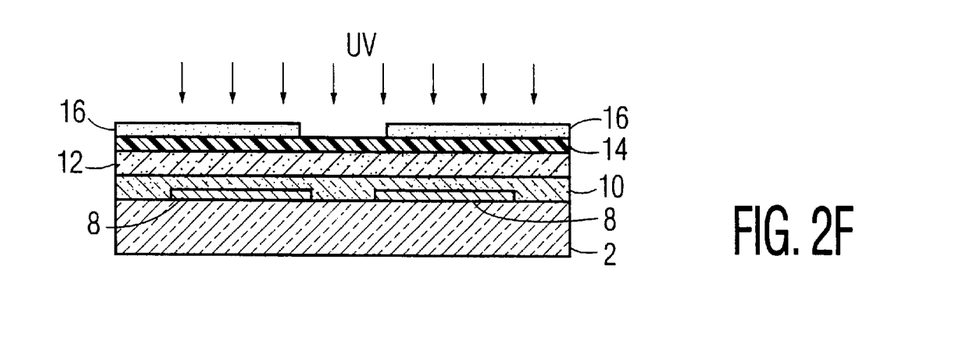

11) Expose to Ultraviolet (UV) light (see FIG. 2F).

Figure 2G:
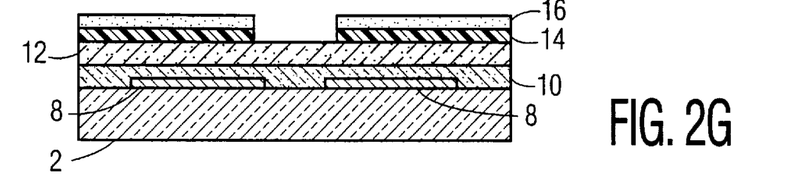

13) Develop the photoresist 14 (see FIG. 2G).

Figure 2H:
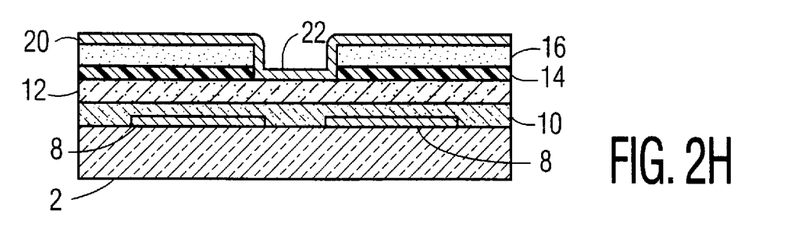

14) Deposit conductor 20 and 22 over the toner 16, photoresist 14 and exposed gate insulator 12 (see FIG. 2H). Note that in the processing example of FIG. 2H, conductors 20 and 22 form a continuous layer.

Figure 2I:
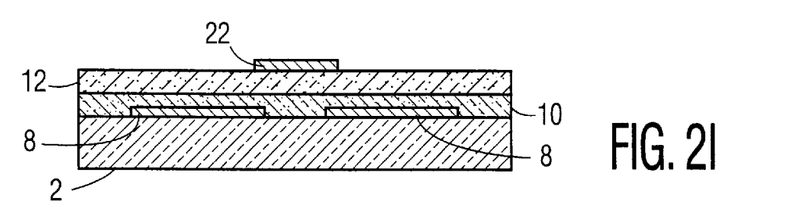

15) Lift-off the conductor 20 situated over the toner 16 and photoresist 14 by exposing the stack to toner solvent and photoresist stripper (see FIG. 2I).

16) Reclean, if necessary.

Figure 2J:
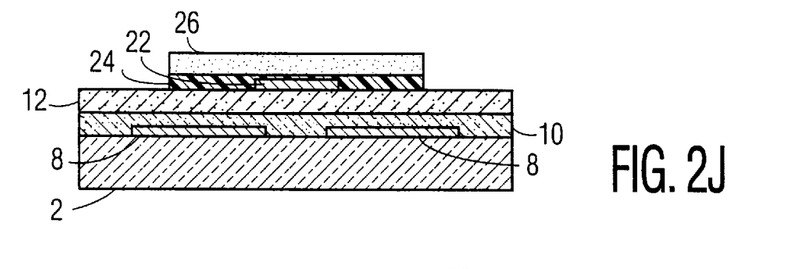

17) Print toner 26 pattern (see FIG. 1C) by repeating steps 9–13 (see FIG. 2J).

Figure 2K:
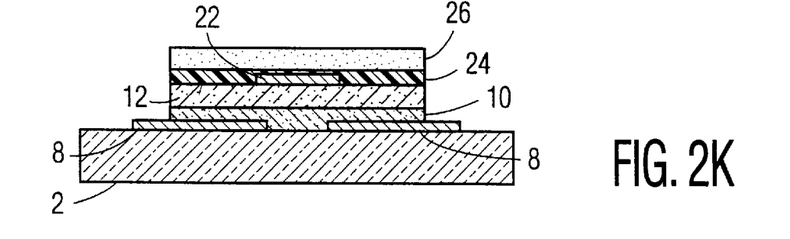

18) Etch the exposed gate insulator 12 and a-Si:H 10 (see FIG. 2K).

Figure 2L:
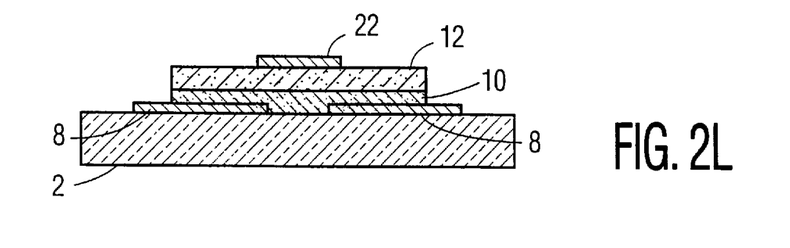

19) Strip the photoresist 24 and toner 26 to obtain the final TFT circuit (see FIG. 2L).

Pattern generation techniques for various embodiments of the invention will now be discussed. The required patterns (see FIGS. 1A–1C in this example) can be generated by using drawing programs that manipulate bitmaps, for example. PostScript programming may be used, but is not in any way critical.

The printing techniques for various embodiments of the invention will now be described. A laser printer or photocopier with a straight paper (i.e., substrate) path should be used. The ultimate resolution obtainable may be comparable to the design rule currently used for AMLCDs fabricated with semiconductor techniques, which is 3–5 $\mu$m. Commercial laser printers can print over an area of 11×17 sq. in. (28×43 cm$^2$) with a resolution of 1,800 dots per inch (dpi), which is equivalent to a design rule of ~14.5 $\mu$m. Much higher resolution is possible, because the optical diffraction limit of laser diodes lies around 1 $\mu$m. Toner particles currently available have ~3 $\mu$m diameter, with long-term prospects of reaching a minimum size of ~1 nm by using fullerene ($C_{60}$) as the toner [U.S. Pat. Nos. 5,188,918 Feb. 23, 1993), and No. 5,232,810 (Aug. 3, 1993)]. The limit set by the photoconductor is comparable to its thickness, which is of the order of 10 to 20$\mu$m at present. With smaller toner particles, the voltage across the photoconductor can be reduced, and so can be its thickness, promising an increase in resolution to allow design rules of 5 $\mu$m or less. This means that the laser-printing techniques can provide the resolution required for the production of the backplane of large-area displays.

To apply the toner to the stack during processing, a photocopier Canon NP 1010 (manufactured by Canon Corp.) with its commercially available cartridge and a commercially available laser printer manufactured by Hewlett Packard, part HP Laser Jet 5MP with its commercial cartridge (Part No. C3903A), were used in the following example, but are not meant to be limiting.

The substrate requirements for various embodiments of the invention will now be discussed. The substrate needs to be a thin, flexible insulator in order to be fed through a laser printer or copier. Additionally, it needs to be able to withstand the heat of further processing. Glass foil is used in the following example, but polymeric substrates such as polyimide film may also prove useful. Also, metal foil coated with electrical insulator can be used as a substrate. However, in AMLCD technology, glass is the preferred substrate. Large-area glass foils as thin as 30 $\mu$m are available commercially, from Schott Glass Company as Part No. D263. 50 $\mu$m glass foils are available from Schott Glass, Part No. AF42, or from Corning Glass, Part No. 0211-00, or from Japanese sources. 50 $\mu$m thick, 8.5 in.×11 in., glass foil is used for the printing demonstration. For the TFT fabrication, 50 $\mu$m thick, 3.0 in.×1.5 in., glass foil is used as an example. The process of the invention can easily be set up to use roll-to-roll glass foil instead of cut glass sheets. The use of glass foils, in addition to their ability to run through the commercial photocopiers and laser printers, also offers the advantage of weight and thickness reduction. The glass foil can be cleaned with Micro laboratory cleaner, rinsed in de-ionized water, and nitrogen-dried before printing. Cleaning can also be done non-chemically, such as by plasma cleaning. Note that yet other methods of cleaning can be used.

The toner requirements will now be discussed. As a rule, the smaller the diameter of the toner particles, the smaller the design rule and the edge definition that can be produced. The diameter of the toner particles used in this example is ~3 $\mu$m. The toner should be post-baked to serve as a mask during the wet etching of a-Si:H in aqueous KOH solution, the heat of a laser printer's (or copier's) fusion rolls not being sufficient to impart resistance. During baking, the toner particles and toner clusters are more thoroughly fused together and they create a continuous layer. Temperatures found useful range from 120 to 160° C., while baking times range from ½ hour to 1 hour. The optimal time and temperature will vary according to the polymers used in the toner, and some toners may be found that are impervious to KOH even without baking. The inventors experimented with a baking temperature of 160° C. and baking times of 2 to 30 minutes in air; 30 min. gave the best result. The post-baked toner is impermeable to the wet etchant. If the toner is used for etching or for the lift-off of chromium, then it is usually baked at 120° C. for one hour in air. Both baking schedules provide similar results and the choice of the temperature is not highly critical. If the toner is directly applied to the glass substrate by printing (no transfer paper is used) then it is baked in an air oven.

Details of possible electrical conductors for use in the present invention will now be discussed. While chromium was used in this example, aluminum was also tested, and other conductors, such as molybdenum-aluminum, or copper, would be expected to work as well. The deposition technique used was thermal evaporation, but sputtering or even electroless plating can be used, for example.

The amorphous silicon deposition will now be discussed. The a-Si:H is deposited by plasma-enhanced chemical vapor deposition (PECVD). The electrical conductivity of the resulting films in certain areas can be increased by phosphine ion shower doping. The electrical conductivity can be further enhanced by laser recrystallization.

The requirements for the gate insulator, in this example, will now be discussed. The layer of electrical insulator used for the gate insulator, must be able to withstand the high temperatures of subsequent processing. Silicon dioxide ($SiO_2$) and silicon nitride ($SiN_x$) are typically used. The properties of $SiO_2$ and $SiN_x$, prepared by PECVD are similar, but empirically it was discovered that $SiN_x$ works better in the a-Si:H TFTs.

The photoresist requirements will now be discussed. The choice of photoresist is not critical. In this example, photoresist AZ 5214 E (Hoechst Celanese, Corp. 70 Meister Ave, Somerville, N.J. 08876) is used.

The stripper requirements will now be discussed. The toner is usually stripped with acetone (in an ultrasonic bath) and then the whole substrate is thoroughly cleaned in 1, 1, 1-trichloroethane, acetone, and methanol (all in the ultrasonic bath). In terms of toner solvents, acetone works well, but is not particularly critical, and other solvents are likely to work just as well. For example, the toner can also be stripped with stripper PRX 100 (Silicon Valley Chemlabs, Inc. 245 Santa Ana Court Sunnyvale, Calif. 94036) which also provides thorough cleaning. The photoresist/toner is removed with stripper AZ 300T (Hoechst Celanese, Corp. 70 Meister Ave, Somerville, N.J. 08876), as well as with PRX 100. Other commercial strippers would likely work as well. If AZ 300 T stripper is used, the temperature range is 40° C. to 80° C.—the higher the temperature, the shorter the time required. If AZ 300 T is replaced with PRX 100, then the stripping is done at 80° C. for 5 to 20 min. in an ultrasonic bath, and 20 min. is sufficient even for very hard-baked photoresists.

The transfer paper and alignment requirements will now be discussed. The inventors considered two approaches to pattern transfer for the present invention. One is to print on the transfer papers commercially available for patterning of printed-circuit boards. The desired pattern, generated by computer, is printed on the transfer paper. The top of the stack and the transfer paper are brought into contact, and heat and pressure are applied causing the toner to stick to the stack. The procedure for transferring the toner from the transfer paper will now be discussed. The printed side of the transfer paper and the top of the stack are brought together and placed between two glass plates that are mechanically pressed together. Then the resulting assembly is placed into an air oven (still pressed together) and baked at 90° C. for 8 minutes. After the bake, the outer glass plates are removed and the stack with the transfer paper stuck to it is soaked in de-ionized water. During this soaking procedure the transfer paper peels from the toner. The result is that the printed toner covers portions of the stack surface, while the rest of the stack surface is bare. If the pattern is transferred directly onto the semiconductor surface, it serves as a mask during etching. If the pattern is transferred onto the a-Si:H covered with photoresist, it serves as a mask during the UV-exposure of the photoresist. In such a case a standard procedure for the photoresist processing is used. The advantage over conventional photolithography is that this procedure does not require a mask aligner. Because the surface of a-Si:H is very smooth, the pattern, when applied directly to a-Si:H surface, does not adhere well. However, the pattern transfers well to a-Si:H surfaces covered with photoresist. The transfer paper used was No. TTS 50, available from DynaArt Designs, 3535 Stillmeadow Lane, Lancaster, Calif. 93536. While the choice of paper is not critical, this particular paper imparts an environmental advantage of being removable by water.

Our second, and preferred, approach is direct electrophotographic printing on the desired surface. In contrast to the preceding case, this procedure does not require additional transfer steps. Therefore, higher resolution and lower cost are possible.

Etching requirements will now be discussed. The a-Si:H was etched away in KOH solution at ~50° C. The $SiN_x$ was etched in 10% HF at room temperature. Dry etching is also possible.

EXAMPLE

Thin-film transistors (TFTs) are fabricated on 50 $\mu$m thick alkali-free glass foil 2 (Schott No. AF45), as shown in FIG. 2A. The TFTs have a simple top gate staggered structure that requires only three patterning steps. These include direct printing, and transfer of toner masks. The three toner patterns are shown in FIGs. 1A–1C. The channel length and width are 100 $\mu$m and 1 mm, respectively (see FIG. 1A). The width of the gate electrode is 300 $\mu$m (see FIG. 1B). The entire process sequence is shown in FIGS. 2A–2L. Begin by printing the negative source-drain toner 4 pattern (made with a laser printer, see FIG. 1A) by feeding the pre-cleaned glass foil 2 through a photocopier. This toner 4 is baked in air at 120° C. for one hour. A 100 nm-thick layer of chromium (Cr) 6, 8 for the source-drain contacts then is thermally evaporated onto the substrate. The Cr 6,8 is patterned by lift-off with acetone, leaving Cr 8 portions on substrate 2, and then the surface is cleaned further by sequential rinsing in 1,1, 1-trichloroethane, acetone and methanol. The 250 nm thick channel layer of undoped a-Si:H 10 and the 300 nm thick gate insulator layer of silicon nitride ($SiN_x$) 12 are deposited in a three-chamber plasma enhanced chemical vapor deposition system using dc and rf excitation, respectively. A layer of at least equal thickness of $SiN_x$, (not shown) then is deposited on the back side of the glass foil substrate 2 to prevent etching of the glass by HF during further processing. Semiconductor and insulator layers must be coated with photoresist 14 before toner transfer. For the following patterning steps, the transfer paper technique is used to enable alignment of successive mask levels. The negative gate toner 16 pattern (see FIG. 1B), is printed on transfer paper 18 using a laser printer (not shown). The printed side of the transfer paper 18 and the glass substrate 2 are brought in contact and are aligned under an optical microscope. Applying heat and pressure causes the toner 16 to stick to the stack. Following a water soak the transfer paper is peeled off the toner 16. Using the toner 16 as mask, the photoresist 14 is exposed to UV-light and is developed. A 100 nm-thick layer of Cr 20 and 22, is thermally evaporated and the gate electrode is patterned by lift-off with acetone and AZ 300T stripper. In the final step, which includes source/drain contact hole opening and transistor separation, the transfer paper technique is used. A positive toner 26 etch mask is printed (see FIG. 1C) and then the $SiN_x$ 12 is etched in 10% HF, and the a-Si:H 10 is etched in ~50° C. KOH solution. Finally, the photoresist 24 and toner 26 are each stripped off with acetone, if the photoresist 24 is not exposed to greater than 120° C. during processing; otherwise PRX-100 or other suitable stripper must be used to remove the photoresist 24.

Figure 3A:
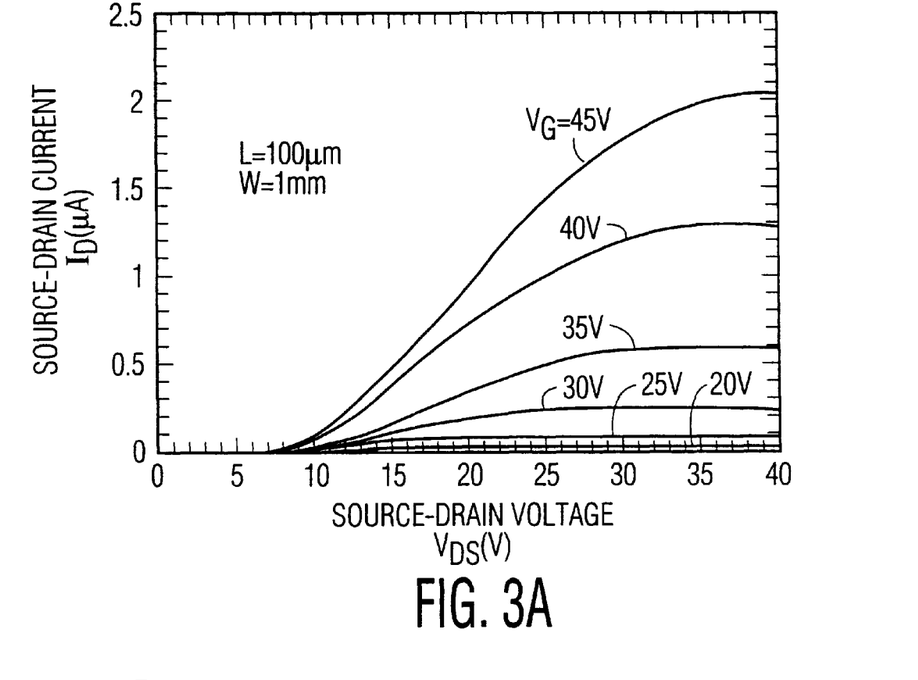
FIG. 3A shows the source-drain current as a function of a source-drain voltage for six different gate voltages for one embodiment of the invention.
Figure 3B:
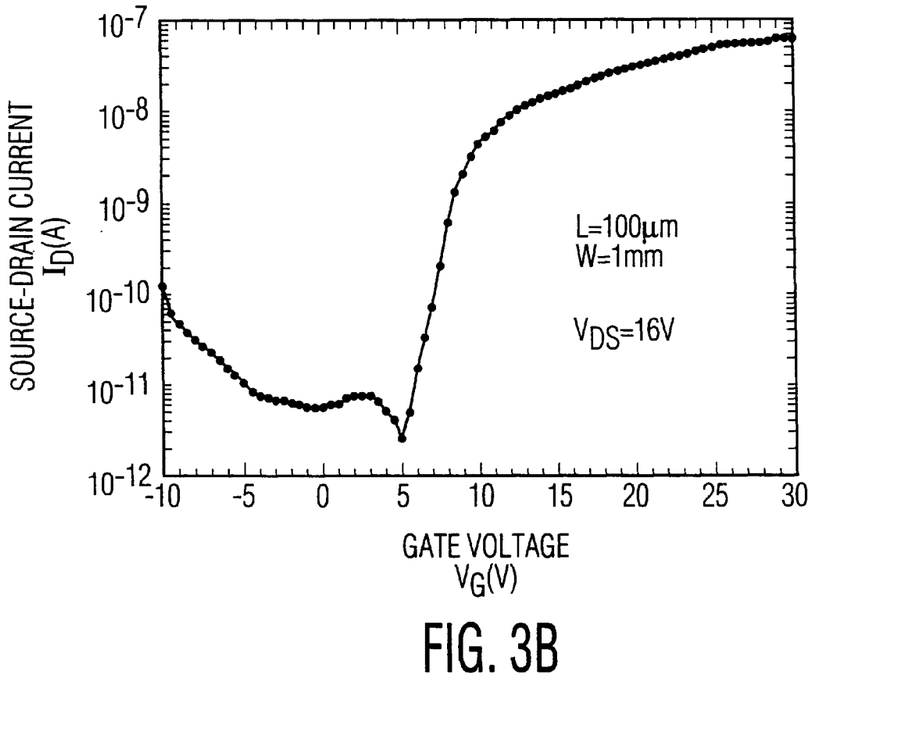
FIG. 3B shows the drain current vs. gate voltage for $V_{DS}=16$ V for one embodiment of the invention. The source electrode is grounded.

The electrical characteristics of a transistor fabricated as described above are shown in FIGS. 3A–3B. As shown, the electrophotographic printing can replace all conventional photolithographic steps in TFT fabrication.

Technologies exist for improving and simplifying the printing steps. A resolution of ~1$\mu$m can be achieved when small toner particles are used in a laser printer. Specialized printers and toners have been developed with such resolution, and even smaller dimensions can be expected. Alignment of each toner level with the patterned substrate directly in the electrophotographic printer can substitute for the transfer paper steps. Such alignment tools already exist. In four-color printing or color copiers, the negative source-drain pattern could be red toner, the negative gate, green toner, and the positive pattern, blue toner, for example.

Glass foil substrates enable the application of roll-to-roll printing to TFT circuit fabrication with present-day amorphous silicon technology. Using electrophotographic printing enables high throughput combined with the dynamic pattern correction needed in the manufacture of large-area circuits.

In terms of ancillary circuit elements, it will be obvious to one skilled in the art that if a transistor can be made, then so can a diode. Resistors can be added by serpentine, narrow conductor patterns, while capacitors can be provided by interdigitated finger patterns and alternating conductor-passivation stacks. Also, using the inventive techniques transparent conducting oxides and color filters can be patterned.

Although various embodiments of the invention are shown and described herein, they are not meant to be limiting, those of skill in the art may recognize various modifications to the embodiments, which modifications are meant to be covered by the spirit and scope of the appended claims. For example, positive or negative toner masks can be used in the processing steps described above. More specifically, for example, a positive mask can be used in producing source drain contacts, in which processing the associated Cr film for the contact material is etched. Also, in another embodiment, a layer of doped amorphous silicon is inserted between the source drain contacts and the undoped amorphous silicon layer, for improving the performance of the TFT that is fabricated. In yet another embodiment, the TFT structure is inverted, whereby the gate electrode is directly placed on the glass foil substrate first, followed by the other layers in appropriate order.

What is claimed is:

1. A method for producing thin film transistors, comprising the steps of:

electrophotographically printing a negative source-drain pattern on a clean substrate in the form of toner, thereby initiating the formation of a stack;

post-baking the toner;

depositing an electrical conductor on the above;

dissolving the toner with a solvent to lift off the portion of the conductor deposited on the toner;

depositing amorphous silicon on top of the stack;

depositing gate insulator on the top and passivation on the bottom of the stack;

depositing photoresist on top of the stack;

applying a negative gate toner pattern to the top of the stack;

exposing the photoresist to ultraviolet light;

developing the photoresist;

depositing an electrical conductor on the top of the stack;

lifting-off the conductor deposited over the toner and photoresist by exposing the stack to a stripper;

applying photoresist to the top of the stack;

applying to the top of the stack a positive toner pattern for contact hole opening and transistor separation;

exposing the photoresist to ultraviolet light;

developing the photoresist;

etching the exposed gate insulator and amorphous silicon; and stripping the photoresist and toner to obtain the desired thin film transistors.

2. The method of claim 1, wherein the step of applying the negative gate toner is by direct electrophotographic printing on the stack, followed by post-baking the toner.

3. The method of claim 1, wherein the step of applying the positive toner pattern is by direct electrophotographic printing on the stack, followed by post-baking the toner.

4. The method of claim 1, wherein the step of applying the negative gate toner is by electrophotographic printing to transfer paper and then transferring the toner to the stack by contacting it with the transfer paper, providing heat and pressure, and removing the paper to leave the toner on the top of the stack.

5. The method of claim 1, wherein the step of applying the positive toner pattern is by electrophotographic printing to transfer paper and then transferring the toner to the stack by contacting it with the transfer paper, providing heat and pressure, and removing the paper to leave the toner on the top of the stack.

6. The method of claim 1, wherein the electrical conductor is selected from the group consisting of chromium, aluminum, titanium, tungsten, tantalum, and their alloys.

7. The method of claim 1, wherein the substrate includes a flexible insulator.

8. The method of claim 1, wherein the substrate includes glass foil.

9. The method of claim 1, wherein the substrate includes polyimide film.

10. The method of claim 1, wherein the substrate includes a metal foil covered with an electrical insulator.

11. The method of claim 1, wherein the gate insulator is selected from the group consisting of silicon nitride and silicon dioxide.

12. The method of claim 1, wherein the steps of applying the toner use a laser printer.

13. The method of claim 1, wherein the steps of applying the toner use a photocopier.

14. The method of claim 1, wherein the steps of depositing the conductor use thermal evaporation.

15. The method of claim 1, wherein the step of depositing the amorphous silicon uses plasma enhanced chemical vapor deposition.

16. The method of claim 1, wherein the step of depositing the gate insulator uses plasma enhanced chemical vapor deposition.

17. A method for patterning a sheet material comprising the steps of:
    applying dry toner to said sheet material in a configuration forming a toner etch having a desired pattern;
    exposing said sheet material with said toner pattern to an etchant for a predetermined period of timer; and
    removing said toner from said patterned sheet material.

18. The method of claim 17, wherein said step of applying dry toner consists of direct printing of said toner upon said sheet material.

19. The method of claim 11, wherein said steps of applying dry toner includes the steps of:
    direct printing onto toner transfer paper;
    transferring the toner pattern onto said sheet material by applying heat and pressure; and
    removing said transfer paper.

20. The method of claim 17, wherein prior to said applying step, said sheet material is coated with photoresist, and said method further includes after said applying step the steps of:
    exposing the composite of said sheet material, photoresist, and toner to ultraviolet radiation;
    developing said photoresist;
    exposing the composite of said sheet material, photoresist, and toner to etchant; and
    removing said toner and said photoresist from said sheet material.

21. The method of claim 17, wherein said sheet material consists of electrically conductive material.

22. The method of claim 17, wherein said sheet material consists of semiconductor material.

23. The method of claim 17, wherein said sheet material consists of electrically insulative material.

24. The method of claim 17, wherein said sheet material is multilayered.

25. The method of claim 18, wherein said direct printing is achieved using a laser printer.

26. The method of claim 18, wherein said direct printing is achieved using a photocopier.

27. The method of claim 19, wherein said step of direct printing is achieved by a laser printer.

28. The method of claim 19, wherein said step of direct printing is achieved by a photocopier.

29. The method of claim 20, wherein said step applying dry toner to said sheet material is achieved by a laser printer.

30. The method of claim 20, wherein said step of applying dry toner to said sheet material is achieved by a photocopier.

31. The method of claim 21, wherein said electrically conductive material is selected from the group consisting of metals, and conductive polymers.

32. The method of claim 22, wherein said sheet material is selected from the group consisting of amorphous silicon, and semiconductors.

33. The method of claim 23, wherein said sheet material is selected from the group consisting of silicon dioxide, silicon nitride, and organic polymers.

34. The method of claim 24, wherein the layers of said multilayered sheet materials include electrical conductors, semiconductors, and electrical insulators in a desired combination.

* * * * *